(12) United States Patent
Kim

(10) Patent No.: US 11,423,833 B2
(45) Date of Patent: Aug. 23, 2022

(54) PIXEL CIRCUIT AND ORGANIC LIGHT EMITTING DISPLAY

(71) Applicant: Samsung Display Co., Ltd., Yongin-si (KR)

(72) Inventor: Keunwoo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/129,689

(22) Filed: Dec. 21, 2020

(65) Prior Publication Data

US 2021/0390905 A1 Dec. 16, 2021

(30) Foreign Application Priority Data

Jun. 12, 2020 (KR) ........................ 10-2020-0071859

(51) Int. Cl.
*G09G 3/3233* (2016.01)
*H01L 27/32* (2006.01)
(52) U.S. Cl.
CPC ....... *G09G 3/3233* (2013.01); *H01L 27/3262* (2013.01); *H01L 27/3265* (2013.01); *G09G 2300/0819* (2013.01); *G09G 2300/0852* (2013.01)
(58) Field of Classification Search
CPC ... G09G 2300/0465; G09G 2300/0819; G09G 2300/0439; G09G 2320/043; G09G 2300/0804; G09G 2300/0861; G09G 2300/0842
See application file for complete search history.

(56) References Cited

U.S. PATENT DOCUMENTS

| 6,501,466 B1 | 12/2002 | Yamagishi et al. |
| 9,552,765 B2 | 1/2017 | Lee et al. |
| 2008/0231558 A1* | 9/2008 | Naugler ............... G09G 3/3233 345/76 |
| 2013/0099692 A1* | 4/2013 | Chaji ................... G09G 3/3233 315/224 |

(Continued)

FOREIGN PATENT DOCUMENTS

| CN | 108766990 | 11/2018 |
| CN | 109192076 | 1/2019 |

(Continued)

*Primary Examiner* — Shaheda A Abdin
(74) *Attorney, Agent, or Firm* — H.C. Park & Associates, PLC

(57) ABSTRACT

A pixel circuit includes a first scan thin-film transistor (TFT) receiving a first data voltage, a first storage capacitor maintaining a first gate voltage corresponding to the first data voltage, a first driving TFT having a gate connected to the first storage capacitor and controlling the amount of a first driving current based on the first gate voltage, a first light-emitting device emitting light according to the first driving current, a second scan TFT receiving a second data voltage in response to an emission control signal, a second driving TFT having a gate connected to the gate of the first driving TFT and a source receiving the second data voltage and controlling the amount of a second driving current based on a difference between the first gate voltage and the second data voltage, and a second light-emitting device emitting light according to the second driving current.

14 Claims, 11 Drawing Sheets

(56) References Cited

U.S. PATENT DOCUMENTS

2017/0287390 A1* 10/2017 Lee .................... G09G 3/3233
2019/0325823 A1   10/2019 Yang et al.
2020/0127061 A1    4/2020 Zou

FOREIGN PATENT DOCUMENTS

CN    109274792    1/2019
KR    10-2056765   12/2019

* cited by examiner

PIXEL CIRCUIT AND ORGANIC LIGHT EMITTING DISPLAY

CROSS-REFERENCE TO RELATED APPLICATION

This application claims from and the benefit of Korean Patent Application No. 10-2020-0071859, filed on Jun. 12, 2020, which is hereby incorporated by reference for all purposes as if fully set forth herein.

BACKGROUND

Field

One or more embodiments relate to a pixel circuit and an organic light-emitting display, and more particularly, to a plurality of pixel circuits adjacent to each other.

Discussion of the Background

An organic light-emitting display includes a light-emitting device having brightness that varies by an electric current, for example, an organic light-emitting diode. A pixel circuit of the organic light-emitting diode display includes an organic light-emitting diode, a driving transistor that controls the amount of current output to the organic light-emitting diode according to a voltage between a gate and a source, a switching transistor that transmits a data voltage for controlling a luminance of the organic light-emitting diode to the driving transistor, and a storage capacitor that stores the data voltage.

As the usage of a display apparatus is diversified and a user's eye level is increased, the ratio of the area occupied by a display area displayed on an image out of the total area of the display apparatus is continuously increasing. To this end, research to add various other functions in addition to a function for displaying an image inside the display area is ongoing. In order to operate these other functions, a transmission area may be arranged in the corresponding area. In addition, there is a need for a method capable of reducing the area of a pixel in the corresponding area.

The above information disclosed in this Background section is only for understanding of the background of the inventive concepts, and, therefore, it may contain information that does not constitute prior art.

SUMMARY

One or more embodiments include a pixel circuit capable of reducing the area of pixels, and an organic light-emitting display including the pixel circuit.

Additional aspects will be set forth in part in the description which follows and, in part, will be apparent from the description, or may be learned by practice of the presented embodiments.

According to one or more embodiments, a pixel circuit includes a first pixel circuit and a second pixel circuit. The first pixel circuit may include a first scan thin-film transistor (TFT) receiving a first data voltage in response to a first scan signal, a first storage capacitor maintaining a first gate voltage corresponding to the first data voltage, a first driving TFT having a gate connected to the first storage capacitor and controlling the amount of a first driving current based on the first gate voltage, and a first light-emitting device emitting light according to the first driving current. The second pixel circuit may include a second scan TFT receiving a second data voltage in response to an emission control signal, a second driving TFT having a gate connected to the gate of the first driving TFT and a source receiving the second data voltage through the second scan TFT and controlling the amount of a second driving current based on a difference between the first gate voltage and the second data voltage, and a second light-emitting device emitting light according to the second driving current.

According to one or more embodiments, an organic light-emitting display includes a substrate on which a first display area and a second display area are defined, first pixels arranged in the first display area and each implemented as a first pixel circuit, and second pixels arranged in the second display area and including two pixels each implemented as the first pixel circuit and the second pixel circuit. The first pixel circuit may include a first TFT receiving a first data voltage in response to a first scan signal, a first storage capacitor maintaining a first gate voltage corresponding to the first data voltage, a first driving TFT having a gate connected to the first storage capacitor and controlling the amount of a first driving current based on the first gate voltage, and a first light-emitting device emitting light according to the first driving current. The second pixel circuit may include a second scan TFT receiving a second data voltage in response to an emission control signal, a second driving TFT having a gate connected to the gate of the first driving TFT and a source receiving the second data voltage through the second scan TFT and controlling the amount of a second driving current based on a difference between the first gate voltage and the second data voltage, and a second light-emitting device emitting light according to the second driving current.

These and/or other aspects will become apparent and more readily appreciated from the following description of the embodiments, taken in conjunction with the accompanying drawings in which:

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
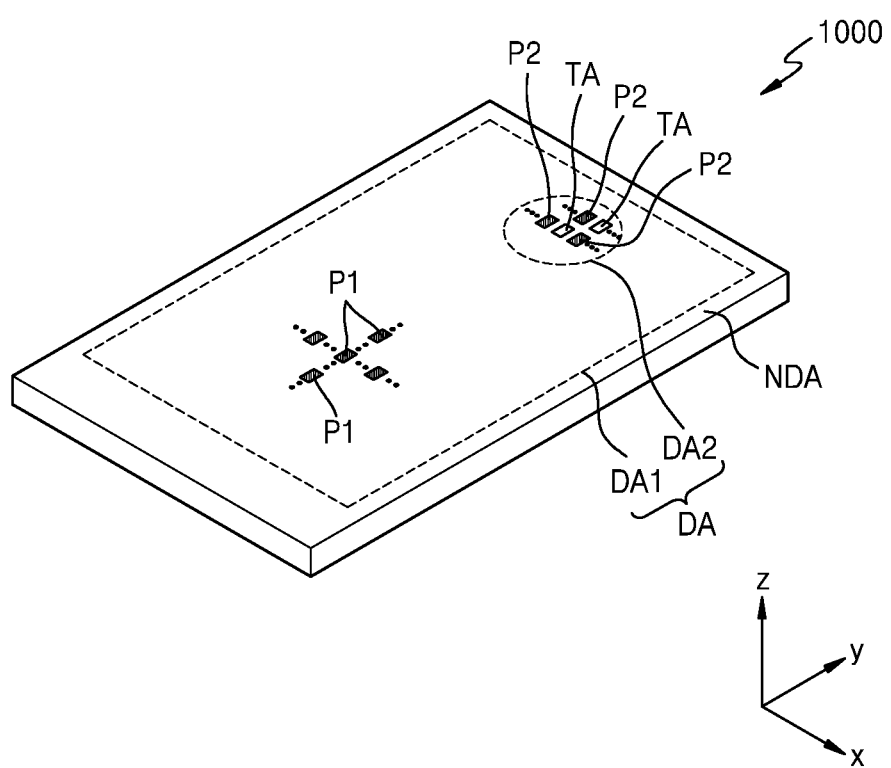
FIG. 1 is a perspective view illustrating an electronic device including a display apparatus according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

The D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, preferred embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

Hereinafter, the inventive concepts will be described in detail with reference to the accompanying drawings. Example embodiments will be described in detail with reference to the accompanying drawings. The same reference numerals are used to denote the same elements, and repeated descriptions thereof will be omitted.

It will be understood that although the terms "first", "second", etc. may be used herein to describe various components, these components should not be limited by these terms. These components are only used to distinguish one component from another. An expression used in the singular encompasses the expression of the plural, unless it has a clearly different meaning in the context. It will be understood that when a unit is referred to as being "connected" to another element, it may be "directly connected" to the other element or "electrically connected" to the other element with intervening elements therebetween. In addition, it will be understood that when a unit is referred to as "comprising" another element, it may not exclude the other element but may further include the other element unless specifically oppositely indicated.

FIG. 1 is a perspective view illustrating an electronic device including a display apparatus according to an embodiment.

Referring to FIG. 1, an electronic device 1000 includes a display area DA and a non-display area NDA. The non-display area NDA may be outside the display area DA. The electronic device 1000 may display an image through a plurality of pixels P1 and P2 arranged in a matrix in the display area DA. The pixels may include first pixels P1 arranged in a first display area DA1 and second pixels P2 arranged in a second display area DA2.

The electronic device 1000 may display a first image by using light emitted from the first pixels P1 arranged in the first display area DA1, and may display a second image by using light emitted from the second pixels P2 arranged in the second display area DA2. According to some embodiments, the electronic device 1000 may display one image by combining the first image and the second image. According to some embodiments, the electronic device 1000 may display a first image and a second image that are independent of each other.

The second display area DA2 may include the transmission area TA between the second pixels P2. The transmission area TA is an area through which light may pass, and no pixels are arranged in the transmission area TA.

The non-display area NDA is an area that does not display an image, and may entirely surround the display area DA. In the non-display area NDA, a driving circuit configured to provide electric signals to the first pixels P1 and the second pixels P2 or a power wire configured to supply power thereto may be arranged. A pad to which an electronic device or a printed circuit board may be electrically connected may be arranged in the non-display area NDA.

As illustrated in FIG. 1, the second display area DA2 may have a circular shape or an elliptical shape on a plane. According to another example, the second display area DA2 may have a polygonal shape such as a square or bar type.

The second display area DA2 may be inside the first display area DA1 as illustrated in FIG. 1. According to another example, the second display area DA2 may be on one side of the first display area DA1, for example, in a y-axis direction in FIG. 1.

The second display area DA2 may be entirely surrounded by the first display area DA1 as illustrated in FIG. 1A. According to another example, the second display area DA2 may be partially surrounded by the first display area DA1. For example, the second display area DA2 may be at one corner of the first display area DA1, and in this case, may be partially surrounded by the first display area DA1.

The area of the first display area DA1 may be considerably larger than the area of the second display area DA2. The first display area DA1 may be referred to as a main display area, and the second display area DA2 may be referred to as an under panel camera (UPC) area. The electronic device 1000 may include one second display area DA2 as illustrated in FIG. 1A, and may include two or more second display areas DA2.

The electronic device 1000 may include a mobile phone, a tablet PC, a laptop computer, and a smart watch or a smart band worn on a wrist.

Figure 2:
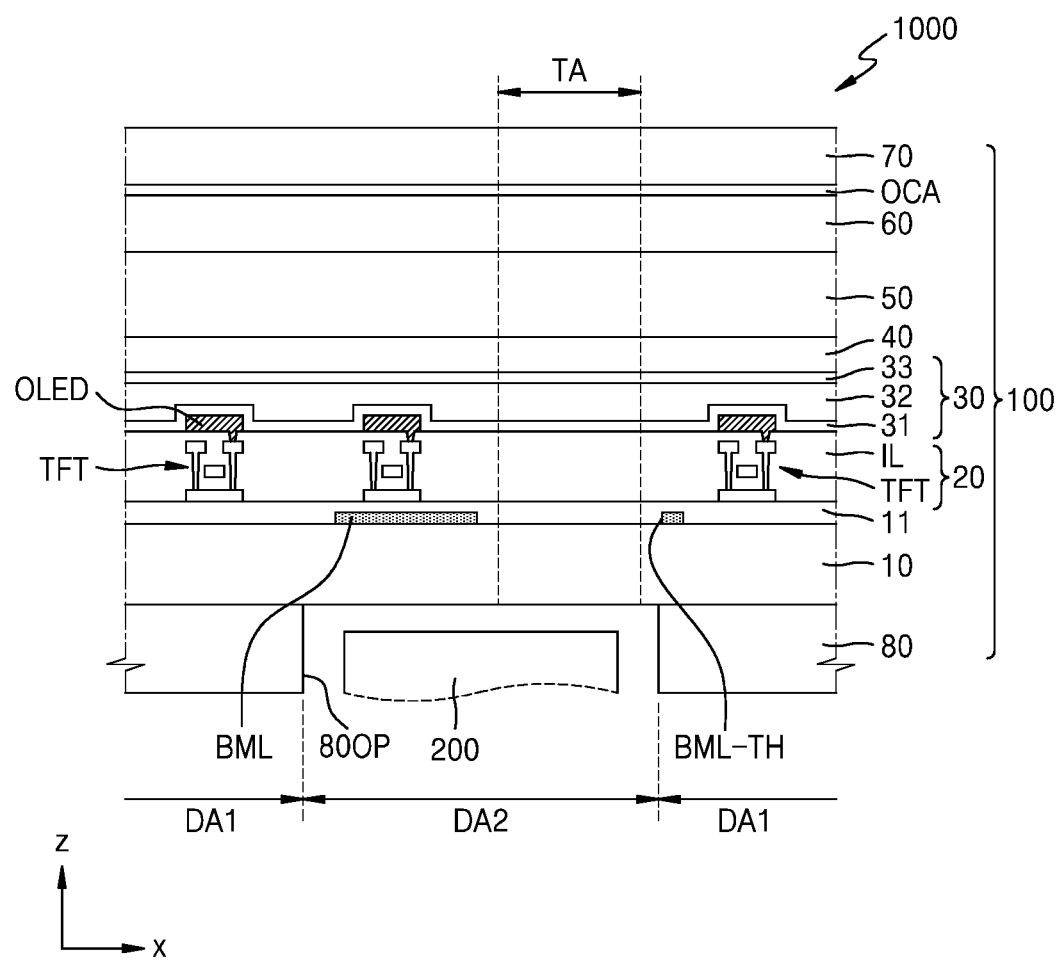
FIG. 2 is a cross-sectional view illustrating a portion of an electronic device including a display apparatus according to an embodiment.

FIG. 2 is a cross-sectional view illustrating a portion of the electronic device 1000 including a display apparatus according to an embodiment.

Referring to FIG. 2, the electronic device 1000 includes a display apparatus 100 and a component 200. The component 200 may be arranged to overlap the display apparatus 100.

The display apparatus 100 may include a substrate 10, a display layer 20, a thin film encapsulation layer 30, an input sensing layer 40, an optical functional layer 50, an anti-reflection layer 60, and a window 70.

The component 200 may be in the second display area DA2. The component 200 may be an electronic device that inputs or outputs light or sound. For example, the electronic device may be a sensor that measures a distance such as a proximity sensor, a sensor that recognizes a part of a user's body (e.g., fingerprints, iris, face, etc.), a small lamp that outputs light, an image sensor that captures an image (e.g., a camera), and the like. The electronic device may use light of various wavelength bands such as visible light, infrared light, and ultraviolet light. The electronic device may use ultrasonic waves or sounds of other frequency bands. According to some embodiments, the component 200 may include sub-components such as a light-emitting portion and a light-receiving portion. The light-emitting portion and the light-receiving portion may have an integrated structure, or a pair of a light-emitting portion and a light-receiving portion may constitute one component 200 in a physically separated structure.

The substrate 10 may include glass or a polymer resin. For example, the polymer resin may include polyethersulfone, polyacrylate, polyether imide, polyethylene naphthalate, polyethylene terephthalide, polyphenylene sulfide, polyarylate, polyimide, polycarbonate or cellulose acetate propionate, and the like. The substrate 10 including the polymer resin may be flexible, rollable, or bendable. The substrate 10 may have a multilayer structure including a layer including a polymer resin and an inorganic layer (not illustrated).

A lower protective film 80 may be on a rear surface of the substrate 10. The lower protective film 80 may be attached on the rear surface of the substrate 10. An adhesive layer may be between the lower protective film 80 and the substrate 10. According to another example, the lower protective film 80 may be formed directly on the rear surface of the substrate 10.

The lower protective film 80 may support and protect the substrate 10. An opening 80OP corresponding to the second display area DA2 may be in the lower protective film 80. The opening 80OP of the lower protective film 80 is a concave portion formed by removing a portion of the lower protective film 80 in a thickness direction thereof. As illustrated in FIG. 2, the opening 80OP may have a shape such as a through-hole, while a portion of the lower protective film 80 is completely removed in the thickness direction thereof. According to another example, the opening 80OP may have a shape of a blind-hole in which a portion of the lower protective film 80 is removed in the thickness direction thereof and one side is blocked.

By forming the opening 80OP in the lower protective film 80, transmittance of the second display area DA2, for example, light transmittance of the transmission area TA may be improved. The lower protective film 80 may include an organic insulating material such as polyethylene terephthalate (PET) or polyimide (PI).

The display layer 20 may be on a front surface of the substrate 10. The display layer 20 may include a plurality of pixels. Each pixel may include a display device or light-emitting device that emits red, green, or blue light. The display device may include an organic light-emitting diode OLED.

The display layer 20 may include a display device layer including the organic light-emitting diode OLED as a display device, a circuit device layer including a thin-film transistor TFT electrically connected to the organic light-emitting diode OLED, and an insulating layer IL. The thin-film transistor TFT and the organic light-emitting diode OLED electrically connected to the thin-film transistor TFT may be arranged in the first display area DA1 and the second display area DA2, respectively.

The second display area DA2 may include the transmission area TA in which the thin-film transistor TFT and the organic light-emitting diode OLED are not arranged. The transmission area TA is an area through which light emitted from and/or directed to the component 200 may pass. In the display apparatus 100, the transmittance of the transmission area TA may be about 30% or more, about 40% or more, about 50% or more, about 60% or more, about 70% or more, about 75% or more, about 80% or more, about 85% or more, or about 90% or more.

A back metal layer BML may be between the substrate 10 and the display layer 20, for example, the substrate 10 and the thin-film transistor TFT. The back metal layer BML may include a through hole BML-TH through which light emitted from the component 200 or directed to the component 200 may pass. The through hole BML-TH of the back metal layer BML is located corresponding to the transmission area TA. The back metal layer BML may prevent diffraction of light through narrow gaps between pixel circuits or wires arranged in the second display area DA2, and may improve characteristics of the thin-film transistor TFT. The back metal layer BML is not arranged in the transmission area TA. For example, the back metal layer BML may include through hole(s) corresponding to the transmission area TA.

The display layer 20 may be sealed with a sealing member. According to an embodiment, the sealing member may include the thin film encapsulation layer 30 arranged on the display layer 20 as illustrated in FIG. 2. The thin film encapsulation layer 30 may include at least one inorganic film and at least one organic film. According to an example, the thin film encapsulation layer 30 may include first and second inorganic films 31 and 33 and an organic film 32 therebetween.

According to another embodiment, the sealing member may include an encapsulation substrate. The encapsulation substrate may be on the display layer 20, and the display layer 20 may be between the substrate 10 and the encapsulation substrate. There may be a gap between the encapsulation substrate and the display layer 20. The encapsulation substrate may include glass. A sealant may be between the substrate 10 and the encapsulation substrate, and the sealant may be arranged in the non-display area NDA illustrated in FIG. 1. The sealant is arranged so as to surround the display area DA to prevent moisture from penetrating into the display area DA through a side surface.

The input sensing layer 40 detects an external input, for example, a touch of an object such as a finger or a stylus pen, so that the electronic device 1000 may obtain coordinate information corresponding to the touch position. The input sensing layer 40 may include a touch electrode and trace lines connected to the touch electrode. The input sensing layer 40 may detect an external input using a mutual cap method or a self cap method.

The input sensing layer 40 may be on the sealing member. According to an example, the input sensing layer 40 may be directly formed on the thin film encapsulation layer 30 or an encapsulation substrate 300B. According to another example, the input sensing layer 40 may be separately formed and then adhered to the sealing member through an adhesive layer such as an optical clear adhesive OCA.

The optical functional layer 50 may improve light efficiency. For example, the optical functional layer 50 may improve front light efficiency and/or side visibility of light emitted from the organic light-emitting diode OLED. In addition, diffraction of light passing through the transmission area TA and directed toward or emitted from the component 200 may be minimized or prevented.

The anti-reflection layer 60 may reduce reflectance of light (external light) incident from the outside toward the display apparatus 100. According to an example, the anti-reflection layer 60 may include an optical plate such as a retarder and/or a polarizer. The retarder may be a film type or a liquid crystal coating type, and may be a $\lambda/2$ retarder and/or a $\lambda/4$ retarder. The polarizer may also be a film type or a liquid crystal coating type. A film-type polarizer may include a stretch-type synthetic resin film, and a liquid crystal coating-type polarizer may include liquid crystals arranged in a certain arrangement.

According to an example, the anti-reflection layer 60 may include a filter plate such as a black matrix and/or a color filter. According to an example, the anti-reflection layer 60 may include a destructive interference structure. The destructive interference structure may include a first reflective layer and a second reflective layer on respective layers. First reflected light and second reflected light respectively reflected by the first reflective layer and second reflective layer may destructively interfere, and thus, external light reflectance may be reduced.

The window 70 may be on the anti-reflection layer 60 and may be adhered to the anti-reflection layer 60 through an adhesive layer such as an optical clear adhesive OCA. Although the window 70 is illustrated as being arranged on the anti-reflection layer 60 in FIG. 2, according to another example, positions of the anti-reflection layer 60 and the optical functional layer 50 may be changed. In this case, the window 70 may be adhered to the optical functional layer 50 through an adhesive layer such as an optical clear adhesive OCA. According to another example, the optical clear adhesive OCA may be omitted under the window 70.

One component 200 may be on the second display area DA2 or a plurality of components 200 may be arranged. When the electronic device 1000 includes the plurality of components 200, the number of second display areas DA2 of the electronic device 1000 may correspond to the number of components 200. For example, the electronic device 1000 may include a plurality of second display areas DA2 apart from each other. According to another example, a plurality of components 200 may be arranged on one second display area DA2. For example, the electronic device 1000 may include a bar-type second display area DA2, and a plurality of components 200 may be arranged to be apart from each other in a length direction (e.g., an x direction in FIG. 1) of the second display area DA2.

In FIG. 2, an embodiment in which the display apparatus 100 includes the organic light-emitting diode OLED as a display device is illustrated, but the display apparatus 100 of the disclosure is not limited thereto. According to another embodiment, the display apparatus 100 may be a light-emitting display (an inorganic light-emitting display or an inorganic EL display) including an inorganic light-emitting device such as a micro LED, or a display apparatus such as a quantum dot light emitting display. For example, a light-emitting layer of a display element provided in the display apparatus 100 may include organic matter, inorganic matter, quantum dots, organic matter and quantum dots, or inorganic matter and quantum dots.

Figure 3:
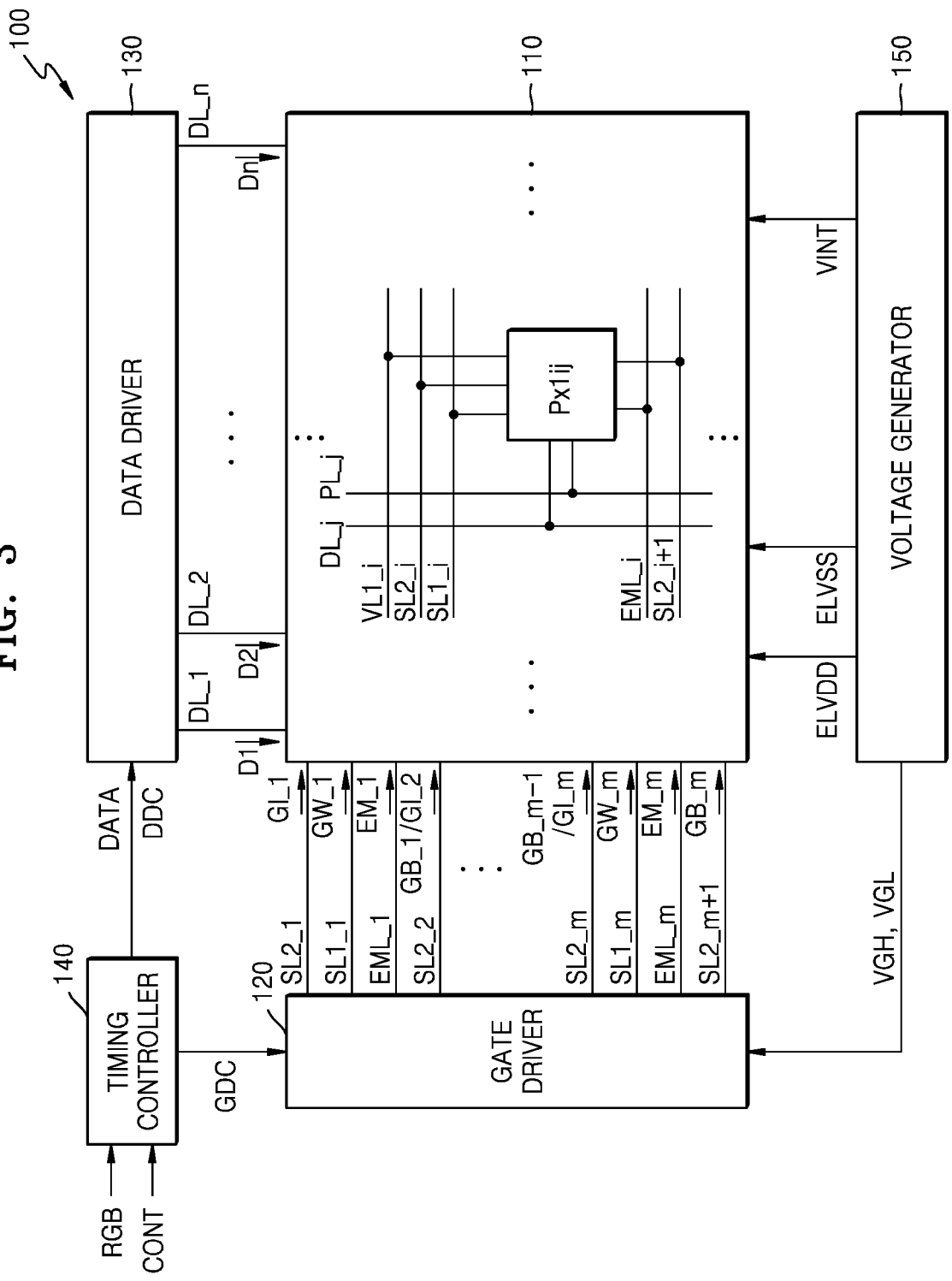
FIG. 3 is a block diagram illustrating an organic light-emitting display according to an embodiment.

FIG. 3 is a block diagram illustrating an organic light-emitting display 100 according to an embodiment.

Referring to FIG. 3, the organic light-emitting display 100 includes a display unit 110, a gate driver 120, a data driver 130, a timing controller 140, and a voltage generator 150.

The display unit 110 includes pixels PX such as a first pixel PX1$ij$ located in an $i^{th}$ row and a $j^{th}$ column, where i is a natural number of 1 or more and m or less, and j is a natural number of 1 or more and n or less. For ease of understanding, only one first pixel PX1$ij$ is illustrated in FIG. 1, but the display unit 110 includes a plurality of first pixels PX1 arranged, for example, in a matrix form in the first display area (DA1 in FIG. 1), as well as a plurality of second pixels PX2 arranged in the second display area DA2. The first pixels PX1 and the second pixels PX2 may be collectively referred to as pixels PX. Each of the first pixels PX1 and the second pixels PX2 will be described in more detail below with reference to FIGS. 4 to 11.

The pixels PX are connected to first scan lines SL1_1 to SL1_$m$, second scan lines SL2_1 to SL2_$m$+1, emission control lines EML_1 to EML_m, and data lines DL_1 to DL_n. The pixels PX are connected to power lines PL_1 to PL_n and voltage lines VL_1 to VL_m. For example, as illustrated in FIG. 3, the first pixel PX1$ij$ may be connected to the first scan line SL1_$i$, the second scan line SL2_$i$, the emission control line EML_i, the data line DL_j, the power line PL_j, the voltage line VL_i and the second scan line SL2_$i$+1. The second scan line SL2_$i$+1 may be referred to as a third scan line with respect to the first pixel PX1$ij$.

The first scan lines SL1_1 to SL1_$m$, the second scan lines SL2_1 to SL2_$m$+1, the emission control lines EML_1 to EML_m, and the voltage lines VL_1 to VL_m may extend in a first direction (e.g., a row direction) and be connected to the pixels PX located in the same row. The data lines DL_1 to DL_n and the power lines PL_1 to PL_n may extend in a second direction (e.g., a column direction) and be connected to the pixels PX located in the same column.

The first scan lines SL1_1 to SL1_$m$ transmit first scan signals GW_1 to GW_m output from the gate driver 120 to the pixels PX in the same row, the second scan lines SL2_1 to SL2_$m$ transmit second scan signals GI_1 to GI_m output from the gate driver 120 to the pixels PX in the same row, and the second scan lines SL2_2 to SL2_$m$+1 transmit third scan signals GB_1 to GB_m output from the gate driver 120 to the pixels PX in the same row, respectively. Both the second scan signal GI_$i$ and the third scan signal GB_$i$−1 are transmitted through the second scan line SL2_$i$, and may actually be the same signal.

The emission control lines EML_1 to EML_m transmit emission control signals EM_1 to EM_m output from the gate driver 120 to the pixels PX in the same row, respectively. The data lines DL_1 to DL_n transmit data voltages D1 to Dm output from the data driver 130 to the pixels PX in the same column, respectively. The first pixel PX1$ij$ receives the first to third scan signals GW_i, GI_i, and GB_i, a data voltage Dj, and the emission control signal EM_i.

The power lines PL_1 to PL_n transmit a first driving voltage ELVDD output from the voltage generator 150 to the pixels PX in the same column, respectively. The voltage lines VL_1 to VL_m transmit an initialization voltage VINT output from the voltage generator 150 to the pixels PX in the same row.

The first pixel PX1$ij$ includes a light-emitting device and a driving TFT that controls the amount of current flowing to the light-emitting device based on the data voltage Dj. The data voltage Dj is output from the data driver 130 and is received by the first pixel PX1$ij$ through the data line DL_j. The light-emitting device may be, for example, an organic light-emitting diode. Because the light-emitting device emits light with brightness corresponding to the amount of current received from the driving TFT, the first pixel PX1$ij$ may express a gray scale corresponding to the data voltage Dj. A pixel PX may correspond to a portion of a unit pixel capable of displaying full color, for example, a sub-pixel. The first pixel PX1$ij$ may further include at least one switching TFT and at least one capacitor. The first pixel PX1$ij$ will be described in more detail below with reference to FIGS. 4 and 5.

The voltage generator 150 may generate voltages configured to drive the first pixel PX1$ij$. For example, the voltage generator 150 may generate the first driving voltage ELVDD, a second driving voltage ELVSS, and an initialization voltage VINT. The level of the first driving voltage ELVDD may be higher than the level of the second driving voltage ELVSS. The level of the initialization voltage VINT may be higher than the level of the second driving voltage ELVSS. A level difference between the initialization voltage VINT and the second driving voltage ELVSS may be less than a threshold voltage used for a light-emitting device of the pixel PX to emit light.

The voltage generator 150 may generate a first gate voltage VGH and a second gate voltage VGL configured to control the switching transistor of the first pixel PX1$ij$ and provide the generated first gate voltage VGH and the second gate voltage VGL to the gate driver 120. When the first gate voltage VGH is applied to the gate of the switching transistor, the switching transistor may be turned off, and when the second gate voltage VGL is applied to the gate of the switching transistor, the switching transistor may be turned on. The first gate voltage VGH may be referred to as a gate-off voltage, and the second gate voltage VGL may be referred to as a gate-on voltage. Switching transistors of the first pixel PX1$ij$ may be p-type MOSFETs, and the level of the first gate voltage VGH may be higher than the level of the second gate voltage VGL. Although not illustrated in FIG. 3, the voltage generator 150 may generate gamma reference voltages and provide them to the data driver 130.

The timing controller 140 may control the display unit 110 by controlling operation timings of the gate driver 120 and the data driver 130. The pixels PX of the display unit 110 may receive a new data voltage D for each frame period and emit light with a luminance corresponding to the data voltage D, thereby displaying an image corresponding to image source data RGB of one frame. According to an embodiment, one frame period may include a gate initialization period, a data writing and anode initialization period, and a light emission period. During the initialization period, the initialization voltage VINT may be applied to the pixels PX in synchronization with a second scan signal GI. During the data writing and anode initialization period, the data voltage D is provided to the pixels PX in synchronization with a first scan signal GW, and the initialization voltage VINT may be applied to the pixels PX in synchronization with a third scan signal GB. During the light emission period, the pixels PX of the display unit 110 may emit light.

The timing controller 140 receives the image source data RGB and a control signal CONT from the outside. The timing controller 140 may convert the image source data RGB into image data DATA based on the characteristics of the display unit 110 and the pixels PX. The timing controller 140 may provide the image data DATA to the data driver 130.

The control signal CONT may include a vertical synchronization signal Vsync, a horizontal synchronization signal Hsync, a data enable signal DE, and a clock signal CLK. The timing controller 140 may control operation timings of the gate driver 120 and the data driver 130 using the control signal CONT. The timing controller 140 may determine a frame period by counting the data enable signal DE of one horizontal scanning period. In this case, the vertical synchronization signal Vsync and the horizontal synchronization signal Hsync supplied from the outside may be omitted. The image source data RGB includes luminance information of the pixels PX. The luminance may have a certain number, for example, 1024 (=210), 256 (=28), or 64 (=26) gray scales.

The timing controller 140 may generate control signals including a gate timing control signal GDC configured to control the operation timing of the gate driver 120 and a data timing control signal DDC configured to control the operation timing of the data driver 130.

The gate timing control signal GDC may include a gate start pulse GSP, a gate shift clock GSC, a gate output enable signal GOE, and the like. The gate start pulse GSP is supplied to the gate driver 120 that generates a first scan signal at the start of a scan period. The gate shift clock GSC is a clock signal commonly input to the gate driver 120 and is a clock signal configured to shift the gate start pulse GSP. The gate output enable signal GOE controls the output of the gate driver 120.

The data timing control signal DDC may include a source start pulse SSP, a source sampling clock SSC, a source output enable signal SOE, and the like. The source start pulse SSP controls a data sampling start point of the data driver 130 and is provided to the data driver 130 at the start of a scan period. The source sampling clock SSC is a clock signal that controls a sampling operation of data in the data driver 130 based on a rising or falling edge. The source output enable signal SOE controls the output of the data driver 130. Meanwhile, the source start pulse SSP supplied to the data driver 130 may be omitted depending on a data transmission method.

The gate driver 120 sequentially generates the first scan signals GW_1 to G_m, the second scan signals GI_1 to GI_m, and the third scan signals GB_1 to GB_m in response to the gate timing control signal GDC supplied from the timing controller 140 by using the first and second gate voltages VGH and VGL provided from the voltage generator 150.

The data driver 130 samples and latches the image data DATA supplied from the timing controller 140 in response to the data timing control signal DDC supplied from the timing controller 140 and converts the image data DATA into data in a parallel data system. When converting the data in the parallel data system, the data driver 130 converts the image data DATA into a gamma reference voltage and converts the gamma reference voltage into an analog data voltage. The data driver 130 provides data voltages D1 to Dn to the pixels PX through the data lines DL_1 to DL_n. The pixels PX receive the data voltages D1 to Dn in response to the first scan signals GW_1 to GW_m.

Figure 4:
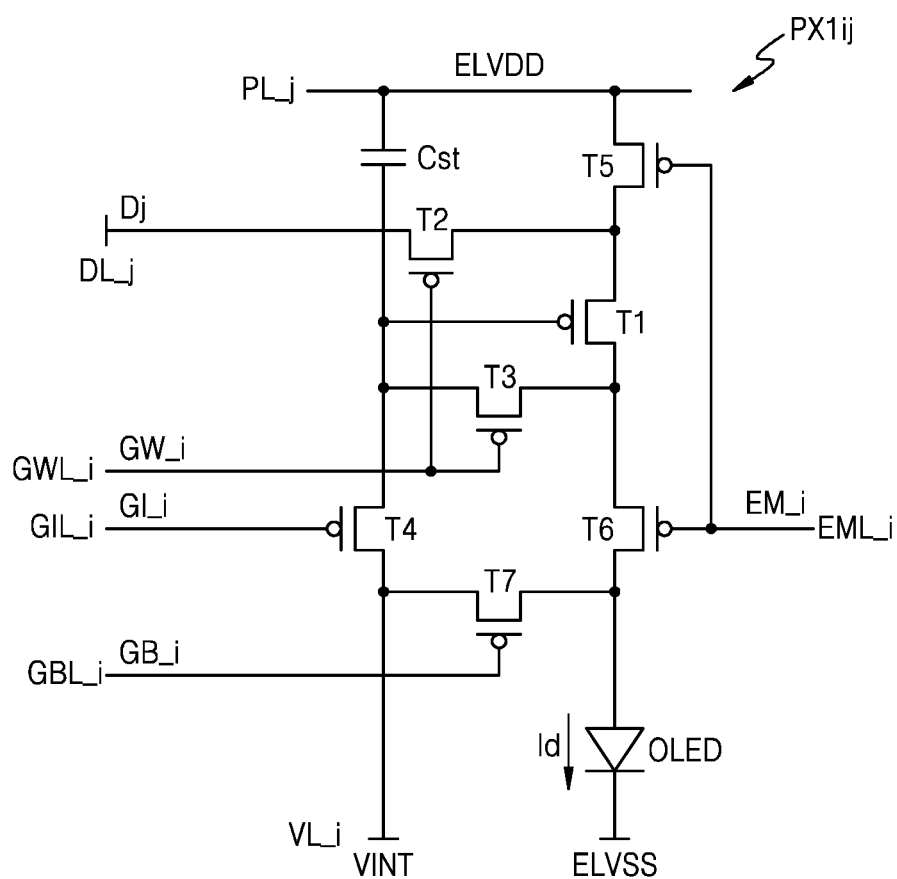
FIG. 4 is a view illustrating a pixel circuit of a first pixel according to an embodiment.

FIG. 4 is a view illustrating a pixel circuit of the first pixel PX1$ij$ according to an embodiment.

Referring to FIG. 4, the first pixel PX1$ij$ is connected to first to third scan lines GWL_i, GIL_i, and GBL_i configured to transmit the first to third scan signals GW_i, GI_i and GB_i, respectively, the data line DL_j configured to transmit the data voltage Dj, and the emission control line EML_i configured to transmit the emission control signal EM_i. The first pixel PX1$ij$ is connected to the power line PL_j configured to transmit the first driving voltage ELVDD and the voltage line VL_i configured to transmit the initialization voltage VINT. The first pixel PX1$ij$ is connected to a common electrode to which the second driving voltage ELVSS is applied. The first pixel PX1$ij$ may correspond to the first pixel PX1$ij$ of FIG. 3.

The first scan line GWL_i corresponds to the first scan line SL1_$i$ of FIG. 1, the second scan line GIL_i corresponds to the second scan line SL2_$j$ of FIG. 1, and the third scan line GBL_i corresponds to the second scan line SL2_$i$+1 of FIG. 1.

The first pixel PX1$ij$ includes a light-emitting device OLED, first to seventh TFTs T1 to T7, and a storage capacitor Cst. The light-emitting device OLED may be an organic light-emitting diode having an anode and a cathode. The cathode may be a common electrode to which the second driving voltage ELVSS is applied.

The first TFT T1 is a driving transistor in which the amount of a drain current is determined according to a gate-source voltage, and the second to seventh TFTs T2 to T7 may be switching transistors that are turned on/off according to the gate-source voltage and substantially a gate voltage.

The first TFT T1 may be referred to as a driving TFT, the second TFT T2 may be referred to as a scan TFT, and the third TFT T3 may be referred to as a compensation TFT, the fourth TFT T4 may be referred to as a gate initialization TFT, the fifth TFT T5 may be referred to as a first emission control TFT, the sixth TFT T6 may be referred to as a second emission control TFT, and the seventh TFT T7 may be referred to as an anode initialization TFT.

The driving TFT T1 may control the amount of a driving current Id flowing from the power line PL_j to the light-emitting device OLED according to a gate voltage. The driving TFT T1 may have a gate connected to a lower electrode of the storage capacitor Cst, a source connected to the power line PL_j through the first emission control TFT T5, and a drain connected to the light-emitting device OLED through the second emission control TFT T6.

The driving TFT T1 may output the driving current Id to the light-emitting device OLED. The amount of the driving current Id may be determined based on a gate voltage of the driving TFT T1. For example, the amount of the driving current Id may be determined based on a difference between a gate-source voltage of the driving TFT T1 and a threshold voltage of the driving TFT T1. The gate-source voltage of the driving TFT T1 corresponds to a difference between the gate voltage and the source voltage. The light-emitting device OLED may receive the driving current Id from the driving TFT T1 and emit light with brightness according to the amount of the driving current Id.

The scan TFT T2 receives the data voltage Dj in response to the first scan signal GW_i. The scan TFT T2 transmits the data voltage Dj to a source of the driving TFT T1 in response to the first scan signal GW_i. The scan TFT T2 may have a gate connected to the first scan line GWL_i, a source connected to the data line GL_j, and a drain connected to the source of the driving TFT T1.

The storage capacitor Cst is connected between the power line PL_j and a gate of the driving TFT T1. The storage capacitor Cst may have an upper electrode connected to the power line PL_j and a lower electrode connected to the gate of the driving TFT T1. The storage capacitor Cst may store a difference between the first driving voltage ELVDD applied to the power line PL_j and the gate voltage of the driving TFT T1, and may maintain the gate voltage of the driving TFT T1.

The compensation TFT T3 is connected in series between the drain and the gate of the driving TFT T1, and may connect the drain and the gate of the driving TFT T1 to each other in response to the first scan signal GW_i. The compensation TFT T3 may have a gate connected to the first scan line GWL_i, a source connected to the drain of the driving TFT T1, and a drain connected to the gate of the driving TFT T1. The compensation TFT T3 may be composed of a plurality of TFTs connected in series with each other and controlled simultaneously by the first scan signal GW_i.

When the compensation TFT T3 is turned on in response to the first scan signal GW_i, the drain and the gate of the driving TFT T1 are connected to each other so that the driving TFT T1 may be diode-connected. The source of the driving TFT T1 receives the data voltage Dj through the scan TFT T2 in response to the first scan signal GW_i, and the data voltage Dj is transmitted to the gate of the driving TFT T1 through the diode-connected driving TFT T1. When the gate voltage of the driving TFT T1 becomes equal to the voltage subtracted by the threshold voltage of the driving TFT T1 from the data voltage Dj, the driving TFT T1 is turned off, and the gate voltage of the driving TFT T1 equal to the voltage subtracted by the threshold voltage of the driving TFT T1 from the data voltage Dj is stored in the storage capacitor Cst.

The gate initialization TFT T4 applies the initialization voltage VINT to the gate of the driving TFT T1 in response to the second scan signal GI_i. The gate initialization TFT T4 may have a gate connected to the second signal line GIL_i, a source connected to the gate of the driving TFT T1, and a drain connected to the voltage line VL_i. The gate initialization TFT T4 may be composed of a plurality of TFTs connected in series with each other and controlled simultaneously by the second scan signal GI_i.

The anode initialization TFT T7 applies the initialization voltage VINT to an anode of the light-emitting device OLED in response to the third scan signal GB_i. The anode initialization TFT T7 may have a gate connected to the second signal line GBL_i, a source connected to the anode of the light-emitting device OLED, and a drain connected to the voltage line VL_i.

The first emission control TFT T5 may connect the power line PL_j and the source of the driving TFT T1 to each other in response to the emission control signal EM_i. The first emission control TFT T5 may have a gate connected to the emission control line EML_i, a source connected to the power line PL_j, and a drain connected to the source of the driving TFT T1.

The second emission control TFT T6 may connect the drain of the driving TFT T1 and the anode of the light-emitting device OLED to each other in response to the emission control signal EM_i. The second emission control TFT T6 may have a gate connected to the emission control line EML_i, a source connected to a drain of the driving TFT T1, and a drain connected to an anode of the light-emitting device OLED.

Figure 5:
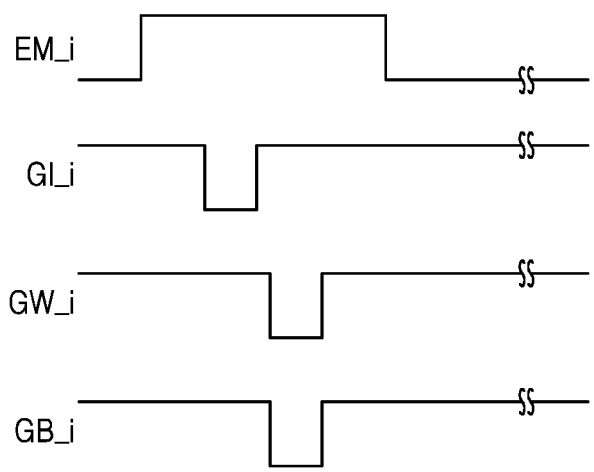
FIG. 5 is a timing diagram of control signals for operating the first pixel illustrated in FIG. 4 during one frame.

FIG. 5 is a timing diagram of control signals configured to operate the first pixel illustrated in FIG. 4 during one frame.

Referring to FIG. 5 along with FIG. 4, in a period in which the emission control signal EM_i has a high level, the first and second emission control TFTs T5 and T6 are turned off, and the light-emitting device OLED does not emit light. A period in which the emission control signal EM_i has a high level may be referred to as a non-emission period.

The second scan signal GI_i has a low level first. At this time, the gate initialization TFT T4 is turned on, and the initialization voltage VINT is applied to the gate of the driving TFT T1. A period in which the second scan signal GI_i has a low level may be referred to as a gate initialization period.

After the second scan signal GI_i transitions to the high level again, the first scan signal GW_i has a low level. At this time, as the data voltage Dj is received through the data line DL_j and the scan TFT T2 and the compensation TFT T4 are turned on, a gate voltage corresponding to the data voltage Dj is stored in the storage capacitor Cst. A period in which the first scan signal GW_i has a low level may be referred to as a data writing period.

The third scan signal GB_i has a low level. At this time, the anode initialization TFT T7 is turned on, and the initialization voltage VINT is applied to the anode of the light-emitting device OLED. A period in which the third scan signal GB_i has a low level may be referred to as an anode initialization period.

Thereafter, as the first scan signal GW_i and the third scan signal GB_i transition to a high level and the emission control signal EM_i has a low level, the first and second emission control TFTs T5 and T6 are turned on. The driving TFT T1 outputs the driving current Id based on the gate voltage stored in the storage capacitor Cst, and the light-emitting device OLED emits light according to the driving current Id. A period in which the emission control signal EM_i has a low level may be referred to as a light emission period.

The second scan signal GI_i may be substantially synchronized with a first scan signal GW_i−1 of the previous row. The third scan signal GB_i may be substantially synchronized with the first scan signal GW_i. According to another example, the third scan signal GB_i may be substantially synchronized with the first scan signal GW_i+1 of the next row.

Hereinafter, a detailed operation process of a first pixel of an organic light-emitting display according to an embodiment will be described in detail.

First, when the high-level emission control signal EM_i is received, the first emission control TFT T5 and the second emission control TFT T6 are turned off, and the driving TFT T1 stops outputting the driving current Id, and the light-emitting device OLED stops emitting light.

Thereafter, the gate initialization TFT T4 is turned on during the gate initialization period in which the low-level second scan signal GI_i is received, and the initialization voltage VINT is applied to the gate of the driving TFT T1, that is, the lower electrode of the storage capacitor Cst. A difference (ELVDD−VINT) between the first driving voltage ELVDD and the initialization voltage VINT is stored in the storage capacitor Cst.

Thereafter, during the data writing period in which the low-level first scan signal GW_i is received, the scan TFT T2 and the compensation TFT T3 are turned on, and the data voltage Dj is received by the source of the driving TFT T1. The driving TFT T1 is diode-connected by the compensation TFT T3 and biased in a forward direction. The gate voltage of the driving TFT T1 rises at the initialization voltage VINT. When the gate voltage of the driving TFT T1 becomes equal to a voltage Dj−|Vth| reduced by a threshold voltage Vth of the driving TFT T1 from the data voltage Dj, the driving TFT T1 is turned off and the increase in the gate voltage of the driving TFT T1 stops. Accordingly, the gate voltage of the driving TFT T1 becomes Dj−|Vth|, and a difference (ELVDD−Dj+|Vth|) between the first driving voltage ELVDD and the gate voltage Dj−|Vth| is stored in the storage capacitor Cst.

Also, during the anode initialization period in which the third low-level scan signal GB_i is received, the anode initialization TFT T7 is turned on and the initialization voltage VINT is applied to the anode of the light-emitting device OLED. By applying the initialization voltage VINT to the anode of the light-emitting device OLED to completely not emit light, a phenomenon in which the light-emitting device OLED finely emits light corresponding to a black gray scale in the next frame may be eliminated.

Thereafter, when the low-level emission control signal EM_i is received, the first emission control TFT T5 and the second emission control TFT T6 are turned on, the driving TFT T1 outputs the driving current Id having an amount corresponding to a voltage stored in the storage capacitor Cst, that is, a voltage ELVDD−Dj obtained by subtracting a threshold voltage |Vth| of the driving TFT T1 from the source-gate voltage ELVDD−Dj+|Vth| of the driving TFT, and the light-emitting device OLED may emit light with a luminance corresponding to the amount of the driving current Id.

Figure 6:
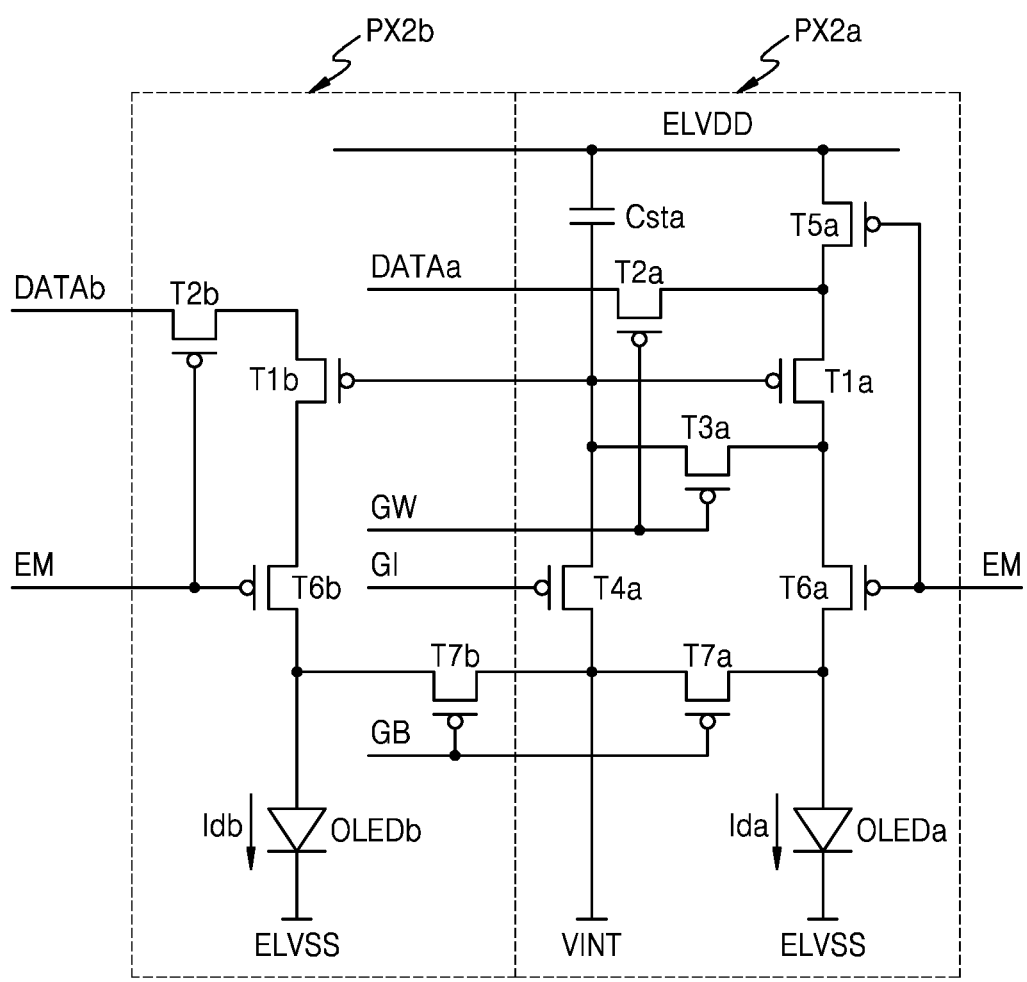
FIG. 6 is a view illustrating a pixel circuit of a second pixel according to an embodiment.

FIG. 6 is a view illustrating a pixel circuit of a second pixel according to an embodiment.

Referring to FIG. 6, the second pixel includes a first pixel circuit PX2a and a second pixel circuit PX2b. Each of the first pixel circuit PX2a and the second pixel circuit PX2b may constitute one sub-pixel. For example, the first pixel circuit PX2a may be a green sub-pixel, and the second pixel circuit PX2b may be a red or blue sub-pixel. The first pixel circuit PX2a and the second pixel circuit PX2b may be arranged adjacent to each other. As described with reference to FIG. 1, the second pixels may be arranged in the second display area DA2.

The first pixel circuit PX2a is substantially the same as the first pixel PX1ij illustrated in FIG. 4. The first pixel circuit PX2a is connected to first to third scan lines transmitting the first to third scan signals GW, GI, and GB, respectively, a data line transmitting a first data voltage DATAa, and an emission control line transmitting an emission control signal EM. The first pixel circuit PX2a is connected to a power line transmitting the first driving voltage ELVDD and a voltage line transmitting the initialization voltage VINT. The first pixel circuit PX2a is connected to a common electrode to which the second driving voltage ELVSS is applied.

The first to third scan signals GW, GI, and GB received from the first pixel circuit PX2a, the first data voltage DATAa, and the emission control signal EM correspond to the first to third scan signals GW_i, GI_i, and GB_i received from the first pixel PX1ij of FIG. 4, the data voltage Dj, and the emission control signal EM_i, respectively. The first driving voltage ELVDD, the initialization voltage VINT, and the second driving voltage ELVSS are commonly applied to the first pixel circuit PX1ij of FIG. 4 as well as the first pixel circuit PX2a and the second pixel circuit PX2b.

The first pixel circuit PX2a includes a first light-emitting device OLEDa, first to seventh TFTs T1a to T7a, and a first storage capacitor Csta substantially the same as the first pixel PX1ij. Though FIG. 6 illustrates that the first pixel circuit PX2a includes seven transistors and one capacitor, this is exemplary and may have other circuit configurations. For example, the first pixel circuit PX2a may include two transistors and one capacitor.

The first pixel circuit PX2a includes a first scan TFT T2a receiving the first data voltage DATAa in response to the first scan signal GW, the first storage capacitor Csta maintaining a first gate voltage corresponding to the first data voltage DATAa, a first driving TFT T1a having a gate connected to the first storage capacitor Csta and controlling the amount of a first driving current Ida based on the first gate voltage, and the first light-emitting device OLEDa emitting light according to the first driving current Ida.

The first pixel circuit PX2a may further include a first compensation TFT T3a connecting a drain and a gate of the first driving TFT T1a to each other in response to the first scan signal GW, a first gate initialization TFT T4a applying the initialization voltage VINT to the gate of the first driving TFT T1a in response to the second scan signal GI, and a first anode initialization TFT T7a applying the initialization voltage VINT to an anode of the first light-emitting device OLEDa in response to the third scan signal GB.

The first pixel circuit PX2a may further include a first emission control TFT T5a applying the first driving voltage ELVDD to a source of the first driving TFT T1a in response to the emission control signal EM, and a second emission control TFT T6a transmitting the first driving current Ida from the first driving TFT T1a to the first light-emitting device OLEDa in response to the emission control signal EM.

Because the first pixel circuit PX2a has substantially the same configuration as the first pixel PX1ij, a detailed description of the circuit configuration is not repeated. The first pixel circuit PX2a is also driven by control signals according to the timing diagram of FIG. 5. First, the operation of the first pixel circuit PX2a will be briefly described.

When the high-level emission control signal EM is received, the first emission control TFT T5a and the second emission control TFT T6a are turned off. The first driving TFT T1a stops outputting the first driving current Ida, and the first light-emitting device OLEDa stops emitting light.

When the second low-level scan signal GI is received, the first gate initialization TFT T4a is turned on, and the initialization voltage VINT is applied to the gate of the first driving TFT T1a.

When the low-level first scan signal GW and the first data voltage DATAa are received, the first scan TFT T2a and the first compensation TFT T3a are turned on, and the first data voltage DATAa is received from the source of the first driving TFT T1a through the first scan TFT T2a. The first driving TFT T1a is diode-connected by the first compensating TFT T3a. When the gate voltage of the first driving TFT T1a becomes equal to a voltage DATAa−|Vth|, which is reduced by the threshold voltage Vth of the first driving TFT T1a from the first data voltage DATAa, the first driving TFT T1a is turned off. Accordingly, a difference (ELVDD−DATAa+|Vth|) between the first driving voltage ELVDD and a first gate voltage DATAa−|Vth| is stored in the storage capacitor Cst. In the following, the gate voltage of the first driving TFT T1a maintained by the storage capacitor Cst is referred to as the first gate voltage DATAa−|Vth|.

When the third low-level scan signal GB is received, the first anode initialization TFT T7a is turned on, and the initialization voltage VINT is applied to the anode of the first light-emitting device OLEDa.

When the low-level emission control signal EM is received, the first emission control TFT T5a and the second emission control TFT T6a are turned on. The first driving TFT T1a outputs the first driving current Ida having an amount corresponding to a voltage ELVDD−DATAa obtained by subtracting the threshold voltage |Vth| of the first driving TFT T1a from a source-gate voltage ELVDD−DATAa+|Vth|, and the first light-emitting device OLEDa emits light with a luminance corresponding to the amount of the first driving current Ida.

The second pixel circuit PX2b includes a second driving TFT T1b, a second scan TFT T2b, and a second light-emitting device OLEDb.

The second scan TFT T2b receives a second data voltage DATAb in response to the emission control signal EM. The second data voltage DATAb is applied to the second pixel circuit PX2b during a period in which the second light-emitting device OLEDb emits light, that is, during a light emission period. The second scan TFT T2b may apply the second data voltage DATAb to a source of the second driving TFT T1b in response to the emission control signal EM. The second scan TFT T2b may have a gate receiving the emission control signal EM, a source receiving the second data voltage DATAb, and a drain connected to the source of the second driving TFT T1b. The emission control signal EM received by the second pixel circuit PX2b is the same as the emission control signal EM received by the first pixel circuit PX2a.

The second driving TFT T1b may have a gate connected to the gate of the first driving TFT T1a of the first pixel circuit PX2a, a source receiving the second data voltage DATAb through the second scan TFT T2b, and a drain connected to the second light-emitting device OLEDb through a first current transmission TFT T6b. The second driving TFT T1b controls the amount of the second driving current Idb based on a difference, that is, DATAb−DATAa+|Vth| between the first gate voltage DATAa−|th|, which is stored by the first storage capacitor Csta of the first pixel circuit PX2a, and the second data voltage DATAb. The second driving TFT T1b outputs the second driving current Idb having an amount corresponding to a voltage DATAb−DATAa+|Vth|−Vth'| obtained by subtracting a threshold voltage |Vth'| of the second driving TFT T1b from the source-gate voltage DATAb−DATAa+|Vth|.

The second driving TFT T1b may have substantially the same planar shape or symmetrical planar shape as the first driving TFT T1a. Because the second driving TFT T1b and the first driving TFT T1a have shapes corresponding to each other and are arranged adjacent to each other, they have substantially the same process error and have substantially similar transistor characteristics. Accordingly, there is no significant difference between the threshold voltage |Vth| of the first driving TFT T1a and the threshold voltage |Vth'| of the second driving TFT T1b, and the amount of the second driving current Idb may be determined by a difference (DATAb−DATAa) between the second data voltage DATAb and the first data voltage DATAa. That is, as the threshold voltage |Vth| of the first driving TFT T1a and the threshold voltage |Vth'| of the second driving TFT T1b cancel each other, the amount of the second driving current Idb may not be affected by the threshold voltage |Vth| of the first driving TFT T1a and the threshold voltage |Vth'| of the second driving TFT T1b.

The second light-emitting device OLEDb may emit light with a luminance corresponding to the amount of the second driving current Idb. The second light-emitting device OLEDb may be an organic light-emitting diode having an anode and a cathode. The cathode may be a common electrode to which the second driving voltage ELVSS is applied.

The second pixel circuit PX2b may further include a second anode initialization TFT T7b. The second anode initialization TFT T7b may apply the initialization voltage VINT to the anode of the second light-emitting device OLEDb in response to the third scan signal GB. The second anode initialization TFT T7b may have a gate receiving the third scan signal GB, a source connected to the anode of the second light-emitting device OLEDb, and a drain receiving the initialization voltage VINT. The third scan signal GB received from the second pixel circuit PX2b is the same as the third scan signal GB received from the first pixel circuit PX2a.

The second pixel circuit PX2b may further include the first current transmission TFT T6b. The first current transmission TFT T6b may transmit the second driving current Idb output from the second driving TFT T1b to the second light-emitting device OLEDb in response to the emission control signal EM. The first current transmission TFT T6b may have a gate receiving the emission control signal EM, a source connected to the drain of the second driving TFT T1b, and a drain connected to the anode of the second light-emitting device OLEDb.

In the first pixel circuit PX2a, the first driving TFT T1a outputs the first driving current Ida having an amount corresponding to a difference (ELVDD−DATAa) between the first driving voltage ELVDD and the first data voltage DATAa, and the first light-emitting device OLEDa emits light with a luminance corresponding to the first driving current Ida. In the second pixel circuit PX2b, the second driving TFT T1b outputs the second driving current Idb having an amount corresponding to a difference (DATAb−DATAa) between the second data voltage DATAb and the first data voltage DATAa, and the second light-emitting device OLEDb emits light with a luminance corresponding to the second driving current Idb. The first and second pixel circuits PX2a and PX2b may generate the first and second driving currents Ida and Idb that are not affected by the threshold voltages of the first and second driving TFTs T1a and T1b, respectively. The second pixel circuit PX2b may omit some of the TFTs by sharing the gate of the first driving TFT T1a of the first pixel circuit PX2a. In the example of FIG. 6, the first pixel circuit PX2a includes seven TFTs and one capacitor, while the second pixel circuit PX2b includes only three TFTs. Accordingly, the second pixel circuit PX2b may be formed in a smaller area, and a relatively wider transmission area (TA in FIG. 1) may be secured.

Figure 7:
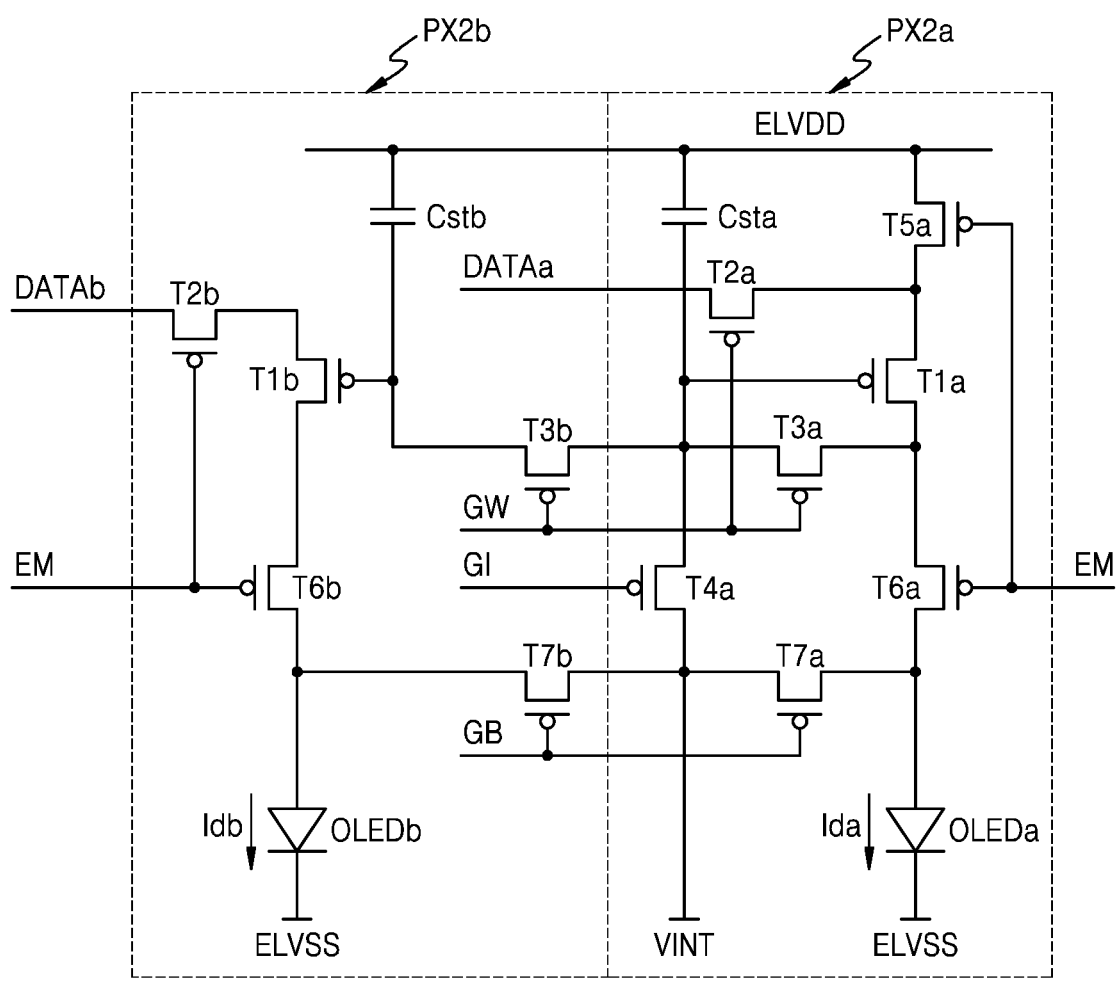
FIG. 7 is a view illustrating a pixel circuit of a second pixel according to another embodiment.

FIG. 7 is a view illustrating a pixel circuit of a second pixel according to another embodiment.

Referring to FIG. 7, the second pixel includes a first pixel circuit PX2a and a second pixel circuit PX2b. Because the first pixel circuit PX2a is the same as a first pixel circuit PX2a illustrated in FIG. 6, a description of the first pixel circuit PX2a will be omitted. The second pixel circuit PX2b is different from the second pixel circuit PX2b illustrated in FIG. 6 in that it further includes a second storage capacitor Cstb and a second compensation TFT T3b. The following description describes the differences.

The second pixel circuit PX2b may further include the second compensation TFT T3b connecting the gate of the second driving TFT T1b to the gate of the first driving TFT T1a in response to the first scan signal GW. The second compensation TFT T3b may have a gate receiving the first scan signal GW, a source connected to the gate of the first driving TFT T1a, and a drain connected to the gate of the second driving TFT T1b. The second compensation TFT T3b may be formed of a plurality of TFTs connected in series with each other and controlled simultaneously by the first scan signal GW. The first scan signal GW received from the second pixel circuit PX2b is the same as the first scan signal GW received from the first pixel circuit PX2a.

The second pixel circuit PX2b may further include a second storage capacitor Vstb connected to the gate of the second driving TFT T1b and maintaining the first gate voltage DATAa−|Vth|. The second storage capacitor Vstb may have a first electrode to which the first driving voltage ELVDD is applied and a second electrode connected to the gate of the second driving TFT T1b. In the data writing period, the second storage capacitor Vstb may store a difference (ELVDD−DATAa+|Vth|) between the first driving voltage ELVDD and the first gate voltage DATAa−|Vth|, and may maintain the difference during the light emission period.

In the data writing period, the low-level first scan signal GW and the first data voltage DATAa are received. In response to the low-level first scan signal GW, the first scan TFT T2a, the first compensation TFT T3a, and the second compensation TFT T3b are turned on. The drain and the gate of the first driving TFT T1a are connected to each other so that the first driving TFT T1a is diode-connected, and the gate of the first driving TFT T1a and the gate of the second driving TFT T2b are also connected to each other. The first data voltage DATAa is transmitted to the gates of the first driving TFT T1a and the second driving TFT T1b through the diode-connected driving TFT T1, and the first gate voltage DATAa−|Vth| is stored in both the first storage capacitor Csta and the second storage capacitor Cstb.

Because the first gate voltage DATAa−|Vth| is independently maintained by the first storage capacitor Csta and the second storage capacitor Cstb, each of the first pixel circuit PX2a and the second pixel circuit PX2b may independently operate more reliably.

Figure 8:
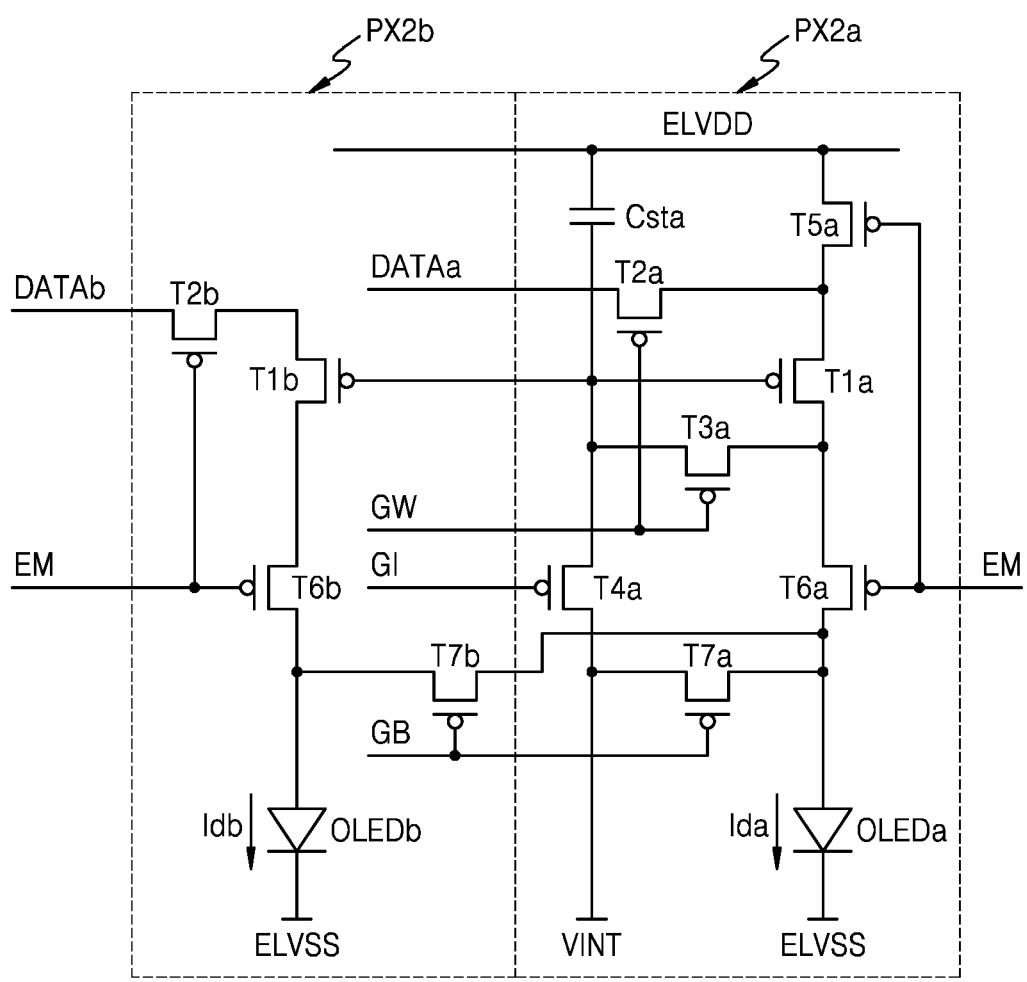
FIG. 8 is a view illustrating a pixel circuit of a second pixel according to another embodiment.

FIG. 8 is a view illustrating a pixel circuit of a second pixel according to another embodiment.

Referring to FIG. 8, the second pixel includes the first pixel circuit PX2a and the second pixel circuit PX2b. Because the first pixel circuit PX2a is the same as the first pixel circuit PX2a illustrated in FIG. 6, a description of the first pixel circuit PX2a will be omitted. The second pixel circuit PX2b has a difference in a connection relationship between the second anode initialization TFT T7b as compared with the second pixel circuit PX2b illustrated in FIG. 6. The following description describes the differences.

The second anode initialization TFT T7b may connect the anode of the second light-emitting device OLEDb to the anode of the first light-emitting device OLEDa in response to the third scan signal GB. The second anode initialization TFT T7b may have a gate receiving the third scan signal GB, a source connected to the anode of the second light-emitting device OLEDb, and a drain connected to the anode of the first light-emitting device OLEDa.

In response to the low-level third scan signal GB, the first anode initialization TFT T7a and the second anode initialization TFT T7b are turned on, and the initialization voltage VINT is applied to the anode of the first light-emitting device OLEDa and the anode of the second light-emitting device OLEDb.

The level of the initialization voltage VINT received from the anode of the second light-emitting device OLEDb through the first anode initialization TFT T7a and the second anode initialization TFT T7b may be higher than the level of the initialization voltage VINT received from the anode of the first light-emitting device OLEDa through the first anode initialization TFT T7a. The first light-emitting device OLEDa and the second light-emitting device OLEDb may include light-emitting materials that emit light of different colors. By applying the initialization voltage VINT of a different level according to the material properties of the first light-emitting device OLEDa and the second light-emitting device OLEDb, problems such as delayed light emission in which light of a specific color is emitted late may be solved.

Figure 9:
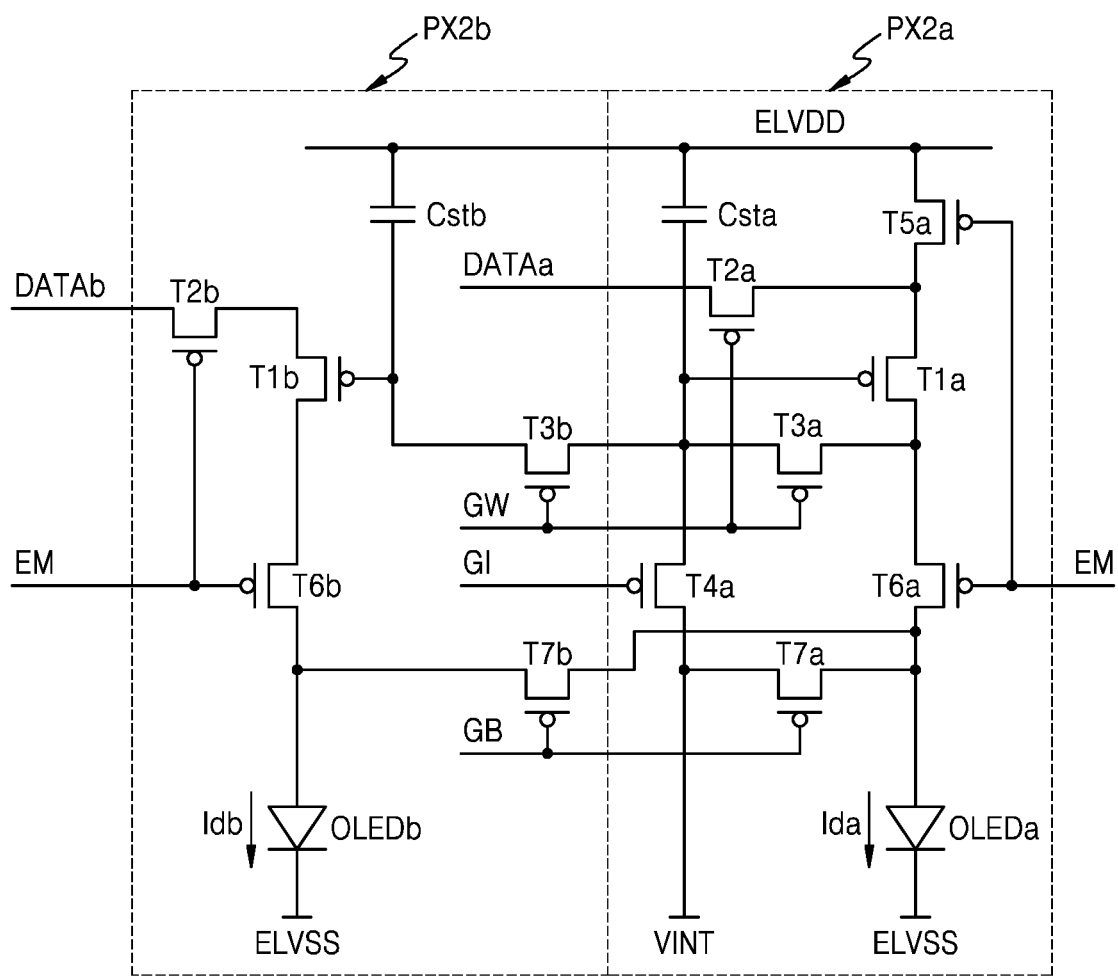
FIG. 9 is a view illustrating a pixel circuit of a second pixel according to another embodiment.

FIG. 9 is a view illustrating a pixel circuit of a second pixel according to another embodiment.

Referring to FIG. 9, the second pixel includes the first pixel circuit PX2a and the second pixel circuit PX2b. Because the first pixel circuit PX2a is the same as the first pixel circuit PX2a illustrated in FIG. 6, a description of the first pixel circuit PX2a will be omitted. The second pixel circuit PX2b has a difference in a connection relationship between the second anode initialization TFT T7b as compared with the second pixel circuit PX2b illustrated in FIG. 7. The following description discusses the differences.

The second anode initialization TFT T7b may connect the anode of the second light-emitting device OLEDb to the anode of the first light-emitting device OLEDa in response to the third scan signal GB. The second anode initialization TFT T7b may have a gate receiving the third scan signal GB, a source connected to the anode of the second light-emitting device OLEDb, and a drain connected to the anode of the first light-emitting device OLEDa. In response to the low-level third scan signal GB, the first anode initialization TFT T7a and the second anode initialization TFT T7b are turned on, and the initialization voltage VINT is applied to the anode of the first light-emitting device OLEDa and the anode of the second light-emitting device OLEDb.

Figure 10:
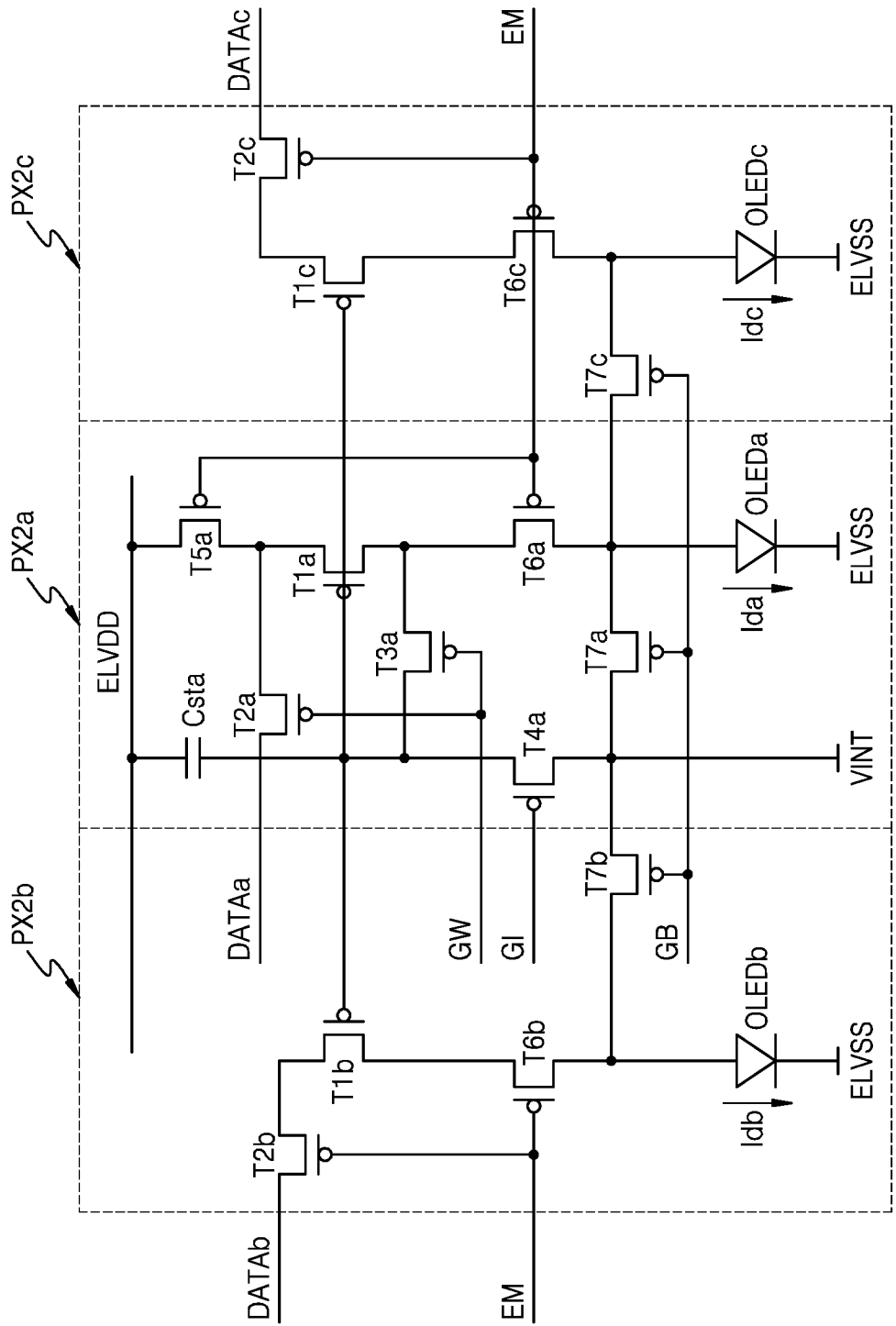
FIG. 10 is a view illustrating a pixel circuit of a second pixel according to another embodiment.

FIG. 10 is a view illustrating a pixel circuit of a second pixel according to another embodiment.

Referring to FIG. 10, the second pixel includes the first pixel circuit PX2a, the second pixel circuit PX2b, and a third pixel circuit PX2c. Because the first pixel circuit PX2a and the second pixel circuit PX2b are the same as the first pixel circuit PX2a and the second pixel circuit PX2b illustrated in FIG. 6, a description of the first pixel circuit PX2a and the second pixel circuit PX2b will be omitted. In the following, the third pixel circuit PX2c will be described.

The third pixel circuit PX2c includes a third driving TFT T1c, a third scan TFT T2c, and a third light-emitting device OLEDc. The first pixel circuit PX2a may constitute a sub-pixel of first color (e.g., green), the second pixel circuit PX2b may constitute a sub-pixel of second color (e.g., red), and the third pixel circuit PX2c may constitute a sub-pixel of third color (e.g., blue).

The third scan TFT T2c receives a third data voltage DATAc in response to the emission control signal EM. The third data voltage DATAc is applied to the third pixel circuit PX2c during a period in which the third light-emitting device OLEDc emits light, that is, during the light emission period. The third scan TFT T2c may apply the third data voltage DATAc to the source of the third driving TFT T1c in response to the emission control signal EM. The third scan TFT T2c may have a gate receiving the emission control signal EM, a source receiving the third data voltage DATAc, and a drain connected to the source of the third driving TFT T1c. The emission control signal EM received by the third pixel circuit PX2c is the same as the emission control signal EM received by the first pixel circuit PX2a and the second pixel circuit PX2b.

The third driving TFT T1c may have a gate connected to the gate of the first driving TFT T1a of the first pixel circuit PX2a, a source receiving the third data voltage DATAc through the third scan TFT T2c, and a drain connected to the third light-emitting device OLEDc through a second current transmission TFT T6c. The third driving TFT T1c controls the amount of the third driving current Idc based on a difference (DATAc−DATAa+|Vth|) between the first gate voltage DATAa−|Vth|, which is stored by the first storage capacitor Csta of the first pixel circuit PX2a, and the third data voltage DATAc. The third driving TFT T1c outputs the third driving current Idc having an amount corresponding to a voltage DATAb−DATAa+|Vth|−th"| obtained by subtracting a threshold voltage |Vth"| of the third driving TFT T1c from the source-gate voltage DATAc−DATAa+|Vth|.

The third driving TFT T1c may have substantially the same planar shape or symmetrical planar shape as the first driving TFT T1a. Because the third driving TFT T1c and the first driving TFT T1a have shapes corresponding to each other and are arranged adjacent to each other, they have substantially the same process error and have substantially similar transistor characteristics. Accordingly, there is no significant difference between the threshold voltage |Vth| of the first driving TFT T1a and the threshold voltage |Vth"| of the third driving TFT T1c, and the amount of the third driving current Idc may be determined by a difference (DATAc−DATAa) between the third data voltage DATAc and the first data voltage DATAa. That is, as the threshold voltage |Vth| of the first driving TFT Tia and the threshold voltage |Vth"| of the third driving TFT T1c cancel each other, the amount of the third driving current Idc may not be affected by the threshold voltage |Vth| of the first driving TFT T1a and the threshold voltage |Vth"| of the third driving TFT T1c.

The third light-emitting device OLEDc may emit light with a luminance corresponding to the amount of the third driving current Idc. The third light-emitting device OLEDc may be an organic light-emitting diode having an anode and a cathode. The cathode may be a common electrode to which the second driving voltage ELVSS is applied.

The third pixel circuit PX2c may further include a third anode initialization TFT T7c. The third anode initialization TFT T7c may connect the anode of the third light-emitting device OLEDc to the anode of the first light-emitting device OLEDa in response to the third scan signal GB. The third anode initialization TFT T7c may have a gate receiving the third scan signal GB, a source connected to the anode of the third light-emitting device OLEDc, and a drain connected to the anode of the first light-emitting device OLEDa. The third scan signal GB received from the third pixel circuit PX2c is the same as the third scan signal GB received from the first pixel circuit PX2a and the second pixel circuit PX2b.

The third pixel circuit PX2c may further include a second current transmission TFT T6c. The second current transmission TFT T6c may transmit the third driving current Idc output from the third driving TFT T1c to the third light-emitting device OLEDc in response to the emission control signal EM. The second current transmission TFT T6c may have a gate receiving the emission control signal EM, a source connected to the drain of the third driving TFT T1c, and a drain connected to the anode of the third light-emitting device OLEDc.

In the first pixel circuit PX2a, the first driving TFT T1a outputs the first driving current Ida having an amount corresponding to the difference (ELVDD−DATAa) between the first driving voltage ELVDD and the first data voltage DATAa, and the first light-emitting device OLEDa emits light with a luminance corresponding to the first driving current Ida. In the second pixel circuit PX2b, the second driving TFT T1b outputs the second driving current Idb having an amount corresponding to the difference (DATAb−DATAa) between the second data voltage DATAb and the first data voltage DATAa, and the second light-emitting device OLEDb emits light with a luminance corresponding to the second driving current Idb. In the third pixel circuit PX2c, the third driving TFT T1c outputs the third driving current Idc having an amount corresponding to the difference (DATAc−DATAa) between the third data voltage DATAc and the first data voltage DATAa, and the third light-emitting device OLEDc emits light with a luminance corresponding to the third driving current Idc.

The first pixel circuit PX2a, the second pixel circuit PX2b, and the third pixel circuit PX2c may generate the first, second, and third driving currents Ida, Idb, and Idc that are not affected by the threshold voltages of the first driving TFT T1a, the second driving TFT T1b, and the third driving TFT T1c, respectively. The second pixel circuit PX2b and the third pixel circuit PX2c may omit some of the TFTs by sharing the gate of the first driving TFT T1a of the first pixel circuit PX2a. In the example of FIG. 10, the first pixel circuit PX2a includes seven TFTs and one capacitor, while the second pixel circuit PX2b and the third pixel circuit PX2c include only three TFTs. Accordingly, the second pixel circuit PX2b and the third pixel circuit PX2c may be formed in a smaller area, and a relatively wider transmission area (TA in FIG. 1) may be secured.

Figure 11:
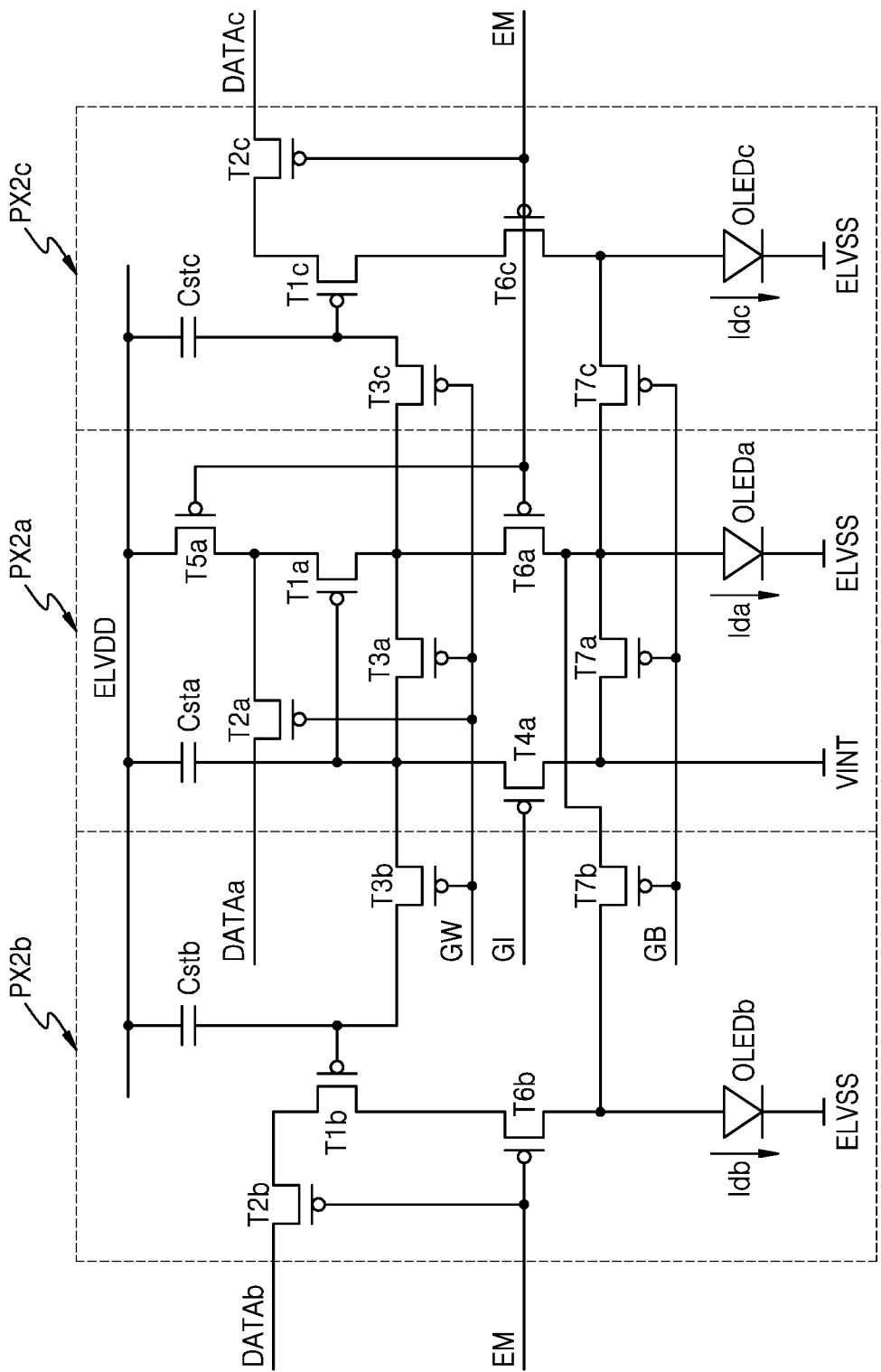
FIG. 11 is a view illustrating a pixel circuit of a second pixel according to another embodiment.

FIG. 11 is a view illustrating a pixel circuit of a second pixel according to another embodiment.

Referring to FIG. 11, the second pixel includes the first pixel circuit PX2a, the second pixel circuit PX2b, and a third pixel circuit PX2c. Because the first pixel circuit PX2a and the second pixel circuit PX2b are the same as the first pixel circuit PX2a and the second pixel circuit PX2b illustrated in FIG. 7, a description of the first pixel circuit PX2a and the second pixel circuit PX2b will be omitted. The third pixel circuit PX2c is different from the third pixel circuit PX2c illustrated in FIG. 10 in that it further includes a third storage capacitor Cstc and a third compensation TFT T3c. The following description discusses the differences.

The third pixel circuit PX2c may further include the third compensation TFT T3c connecting the gate of the third driving TFT T1c to the drain of the first driving TFT T1a in response to the first scan signal GW. The third compensation TFT T3c may have a gate receiving the first scan signal GW, a source connected to the drain of the first driving TFT T1a, and a drain connected to the gate of the third driving TFT T1c. The third compensation TFT T3c may be formed of a plurality of TFTs connected in series with each other and controlled simultaneously by the first scan signal GW.

The third pixel circuit PX2c may further include a third storage capacitor Vstc connected to the gate of the third driving TFT T1c and maintaining the first gate voltage DATAa−|Vth|. The third storage capacitor Vstc may have a first electrode to which the first driving voltage ELVDD is applied and a third electrode connected to the gate of the third driving TFT T1c. In the data writing period, the third storage capacitor Vstc may store the difference (ELVDD−DATAa+|Vth|) between the first driving voltage ELVDD and the first gate voltage DATAa−|Vth|, and may maintain the difference during the light emission period.

In the data writing period, the low-level first scan signal GW and the first data voltage DATAa are received. In response to the low-level first scan signal GW, the first scan TFT T2a, the first compensation TFT T3a, and the second compensation TFT T3b are turned on. The drain and the gate of the first driving TFT T1a are connected to each other so that the first driving TFT T1a is diode-connected, and the gate of the first driving TFT T1a, the gate of the second driving TFT T2b, the gate of the third driving TFT T1c are also connected to each other. The first data voltage DATAa is transmitted to the gates of the first driving TFT T1a and the third driving TFT T1c through the diode-connected driving TFT T1, and the first gate voltage DATAa−|Vth| is stored in the first storage capacitor Csta, the second storage capacitor Cstb, and the third storage capacitor Cstc, respectively.

Because the first gate voltage DATAa−|Vth| is independently maintained by the first storage capacitor Csta, the second storage capacitor Cstb, and the third storage capacitor Cstc, each of the first pixel circuit PX2a, the second pixel circuit PX2b, and the third pixel circuit PX2c may independently operate more reliably.

According to various embodiments of the disclosure, because the area of a pixel may be reduced in an area to which other functions are added, a relatively wide transmission area may be arranged. Accordingly, the display apparatus may provide various functions while maintaining display quality as it is.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A pixel circuit including a first pixel circuit and a second pixel circuit, wherein the first pixel circuit comprises: a first scan thin-film transistor (TFT) receiving a first data voltage in response to a first scan signal; a first storage capacitor maintaining a first gate voltage corresponding to the first data voltage; a first driving TFT having a gate connected to the first storage capacitor and controlling the amount of a first driving current based on the first gate voltage; and a first light-emitting device emitting light according to the first driving current, and the second pixel circuit comprises: a second scan TFT receiving a second data voltage in response to an emission control signal; a second driving TFT having a gate directly connected to the gate of the first driving TFT and a source receiving the second data voltage through the second scan TFT and controlling the amount of a second driving current based on a difference between the first gate voltage and the second data voltage; and a second light-emitting device emitting light according to the second driving current.

2. The pixel circuit of claim 1, wherein the first pixel circuit comprises:
a first compensation TFT connecting a drain and the gate of the first driving TFT to each other in response to the first scan signal;
a first gate initialization TFT applying an initialization voltage to the gate of the first driving TFT in response to a second scan signal; and
a first anode initialization TFT applying the initialization voltage to an anode of the first light-emitting device in response to a third scan signal.

3. The pixel circuit of claim 1, wherein the second pixel circuit further comprises:
a second anode initialization TFT applying the initialization voltage to an anode of the second light-emitting device in response to the third scan signal.

4. The pixel circuit of claim 1, wherein the second pixel circuit further comprises:
a second anode initialization TFT connecting an anode of the second light-emitting device to the anode of the first light-emitting device in response to the third scan signal.

5. The pixel circuit of claim 1, wherein the first pixel circuit comprises:
a first emission control TFT applying a first driving voltage to a source of the first driving TFT in response to the emission control signal; and
a second emission control TFT transmitting the first driving current from the first driving TFT to the first light-emitting device in response to the emission control signal.

6. The pixel circuit of claim 1, wherein the second pixel circuit further comprises:
a first current transmission TFT transmitting the second driving current from the second driving TFT to the second light-emitting device in response to the emission control signal.

7. The pixel circuit of claim 1, further comprising a third pixel circuit,
wherein the third pixel circuit comprises:
a third scan TFT receiving a third data voltage in response to the emission control signal;
a third driving TFT having a gate connected to the gate of the first driving TFT and a source receiving the third data voltage through the third scan TFT and controlling the amount of a third driving current based on a difference between the first gate voltage and the third data voltage; and
a third light-emitting device emitting light according to the third driving current.

8. The pixel circuit of claim 7, wherein the third pixel circuit further comprises:
a third anode initialization TFT connecting an anode of the third light-emitting device to an anode of the first light-emitting device in response to a third scan signal.

9. The pixel circuit of claim 7, wherein the third pixel circuit further comprises:
a second current transmission TFT transmitting the third driving current from the third driving TFT to the third light-emitting device in response to the emission control signal.

10. The pixel circuit of claim 1, wherein the second pixel circuit comprises:
a second compensation TFT connecting a gate of the second driving TFT to the gate of the first driving TFT in response to the first scan signal; and
a second storage capacitor connected to the gate of the second driving TFT and maintaining the first gate voltage.

11. The pixel circuit of claim 10, further comprising a third pixel circuit,
wherein the third pixel circuit comprises:
a third scan TFT receiving a third data voltage in response to the emission control signal;

a third compensation TFT receiving the first gate voltage in response to the first scan signal; and
a third driving TFT having a gate receiving the first gate voltage through the third compensation TFT and a source receiving the third data voltage through the third scan TFT and controlling the amount of a third driving current based on a difference between the first gate voltage and the third data voltage;
a third storage capacitor connected to the gate of the third driving TFT and maintaining the first gate voltage; and
a third light-emitting device emitting light according to the third driving current.

12. An organic light-emitting display comprising:
a substrate on which a first display area and a second display area are defined;
first pixels arranged in the first display area and each implemented as a first pixel circuit; and
second pixels arranged in the second display area and including two pixels each implemented as the first pixel circuit and a second pixel circuit,
wherein the first pixel circuit comprises:
a first scan thin film transistor (TFT) receiving a first data voltage in response to a first scan signal;
a first storage capacitor maintaining a first gate voltage corresponding to the first data voltage;
a first driving TFT having a gate connected to the first storage capacitor and controlling the amount of a first driving current based on the first gate voltage; and
a first light-emitting device emitting light according to the first driving current, and
wherein the second pixel circuit comprises:
a second scan TFT receiving a second data voltage in response to an emission control signal;
a second driving TFT having a gate directly connected to the gate of the first driving TFT and a source receiving the second data voltage through the second scan TFT and controlling the amount of a second driving current based on a difference between the first gate voltage and the second data voltage; and
a second light-emitting device emitting light according to the second driving current.

13. An organic light-emitting display of claim 12, wherein the second display area includes a transmission area between the second pixels.

14. A pixel circuit including a first pixel circuit and a second pixel circuit,
wherein the first pixel circuit comprises:
a first scan thin-film transistor (TFT) receiving a first data voltage in response to a first scan signal;
a first storage capacitor maintaining a first gate voltage corresponding to the first data voltage;
a first driving TFT having a gate connected to the first storage capacitor and controlling the amount of a first driving current based on the first gate voltage; and
a first light-emitting device emitting light according to the first driving current, and
the second pixel circuit comprises:
a second scan TFT receiving a second data voltage in response to an emission control signal;
a second driving TFT having a gate connected to the gate of the first driving TFT and a source receiving the second data voltage through the second scan TFT and controlling the amount of a second driving current based on a difference between the first gate voltage and the second data voltage
a second light-emitting device emitting light according to the second driving current; and
a third pixel circuit,
wherein the third pixel circuit comprises:
a third scan TFT receiving a third data voltage in response to the emission control signal;
a third driving TFT having a gate connected to the gate of the first driving TFT and a source receiving the third data voltage through the third scan TFT and controlling the amount of a third driving current based on a difference between the first gate voltage and the third data voltage; and
a third light-emitting device emitting light according to the third driving current.

\* \* \* \* \*